United States Patent
Hodge et al.

[11] Patent Number: 5,805,036
[45] Date of Patent: Sep. 8, 1998

[54] MAGNETICALLY ACTIVATED SWITCH USING A HIGH TEMPERATURE SUPERCONDUCTOR COMPONENT

[75] Inventors: James D. Hodge, Lincolnwood; Qiang Huang, Glen Ellyn; David S. Applegate, Wheeling, all of Ill.

[73] Assignee: Illinois Superconductor, Mt. Prospect, Ill.

[21] Appl. No.: 440,829

[22] Filed: May 15, 1995

[51] Int. Cl.$^6$ .................................................. H01F 1/00
[52] U.S. Cl. ..................... 335/216; 335/212; 174/125.1
[58] Field of Search ................... 335/212, 216; 505/1, 869, 870; 338/325; 174/125.1; 62/51.1

[56] References Cited

U.S. PATENT DOCUMENTS

| | | | |
|---|---|---|---|
| 565,986 | 10/1896 | Knuttel | 356/346 |
| 3,956,727 | 5/1976 | Wolf. | |
| 4,278,748 | 7/1981 | Dersch | 430/212 |
| 4,727,298 | 2/1988 | Mendel | 315/340 |
| 5,093,645 | 3/1992 | Dorri et al. | 335/216 |
| 5,140,290 | 8/1992 | Dersch | 335/221 |
| 5,279,852 | 1/1994 | Clough et al. . | |
| 5,348,797 | 9/1994 | Clough et al. . | |
| 5,361,054 | 11/1994 | Kneuttel | 335/216 |
| 5,376,626 | 12/1994 | Drehman et al. . | |
| 5,396,206 | 3/1995 | Herd et al. | 505/163 |
| 5,639,616 | 6/1997 | Mendel | 435/7.1 |

*Primary Examiner*—Lincoln Donovan
*Attorney, Agent, or Firm*—Michael D. Rechtin; Foley & Lardner

[57] ABSTRACT

A magnetically-activated switch including a high temperature superconductor. The magnetic switch includes a high temperature superconductor coupled at both ends to a rigid beam, a thermal shield structure is disposed adjacent to the superconductor and a magnetic field source is positioned near the superconductor to allow transitioning of the superconductor in and out of the superconducting state.

21 Claims, 14 Drawing Sheets

MAGNETICALLY ACTIVATED SWITCH USING A HIGH TEMPERATURE SUPERCONDUCTOR COMPONENT

CONTRACTUAL ORIGIN OF THE INVENTION

The United States Government has rights in this invention pursuant to Contract No. DAAL01-92-C-0256 between the United States Army and the assignee of the present invention.

BACKGROUND OF THE INVENTION

The present invention relates generally to switches in electronic circuits. More particularly, the present invention relates to magnetically activated switches using high temperature superconductor components.

Increasing miniaturization and efficiency improvement of electronic components has led to an increased use of very low voltage electronic circuits. These circuits cannot function as intended if conventional switches are used, because the relatively high resistance of conventional switches dissipates an unacceptably high quantity of the power supplied to the circuit. This dissipation leaves insufficient power for the rest of the circuit's components to operate effectively.

A switch constructed in accordance with one form of the invention can be connected in parallel with a DC power supply and a load, allowing current to flow alternatively through the power supply and switch or through the power supply and load. The switch thereby isolates the load from, or connects the load to, the power supply.

In preferred forms of the invention, the switch uses high temperature superconductor active components to transition on demand from low to high resistance and from high to low resistance. Switching of the high temperature superconductor components from the superconducting state to the resistive state and back is accomplished by the application and removal of a magnetic field supplied, for example, by an electromagnet or a conventional solenoid. The resistance change of the switch can be two orders of magnitude or greater, depending on the length and cross-section of the high temperature superconductor components and on the resistance of the rest of the system.

A system employing a magnetically activated switch often does not completely shunt all of the current from the switch to the load. The relative amounts of the current generated by the power supply that are carried by the magnetically activated switch and load are dictated by the amount of resistance in each of the two branches of the circuit. The resistance of the magnetically activated switch in the superconducting mode is equal to the sum of the contact resistances and the resistance of the metallic, e.g., copper, connectors in the switch leg of the circuit. The sum of such resistances can be on the order of 50–100$\mu\Omega$, for example. Optimal switching is achieved when the load resistance is intermediate between the resistance of the magnetically activated switch in the superconducting and nonsuperconducting modes.

The high temperature superconductor magnetically activated switch of the present invention is useful in situations where, for example, the circuit cannot tolerate the relatively high resistance of a conventional switch or relay. The ultralow resistance of the magnetically activated switch in the superconducting mode is most useful in applications where significant power losses or voltage drops across the switch are unacceptable. An example of such a case is when the power supply only produces a very small voltage, such as 20 mV, as is common in circuits for the miniaturized electronic components previously discussed.

It is therefore an object of the invention to provide an improved apparatus and method for producing a magnetically activated switch.

It is another object of the invention to provide a novel apparatus and method for providing thermal shielding for a magnetically activated switch.

It is yet another object of the invention to provide a novel thermally shielded high temperature superconductor based magnetically activated switch.

It is a further object of the invention to provide an improved magnetically activated switch apparatus and method for producing the apparatus which includes a superconducting component.

It is still an additional object of the invention to provide a novel magnetically activated switch including a superconducting component and method for producing the switch which includes a frame structure having a coefficient of thermal expansion similar to that of the superconducting component enabling thermally compatible operation of the switch.

Other objects, features and advantages of the present invention will be apparent from the following description of the preferred embodiments thereof, taken in conjunction with the accompanying drawings described below wherein like components have like numerals throughout the several views.

BRIEF DESCRIPTION OF THE DRAWINGS

FIGS. 5A and 5B illustrate the dynamic response of a magnetically activated switch with continuous current of 5 A flowing through the switch and with the solenoid current pulsed at 5 A which corresponds to a field of about 450 Gauss applied for 40 ms; FIG. 5A shows the current in the solenoid, while

FIGS. 6A and 6B show the dynamic response of a magnetically activated switch with continuous current of 2 A flowing through the switch and with the solenoid current pulsed at 10 A for 40 ms; FIG. 6A shows the current in the solenoid, while

FIGS. 7A and 7B illustrate the dynamic response of a magnetically activated switch with continuous current of 5 A flowing through the switch and with the solenoid current pulsed at 10 A for 40 ms; FIG. 7A shows the current in the solenoid, while

DETAILED DESCRIPTION OF PREFERRED EMBODIMENTS

Figure 1:
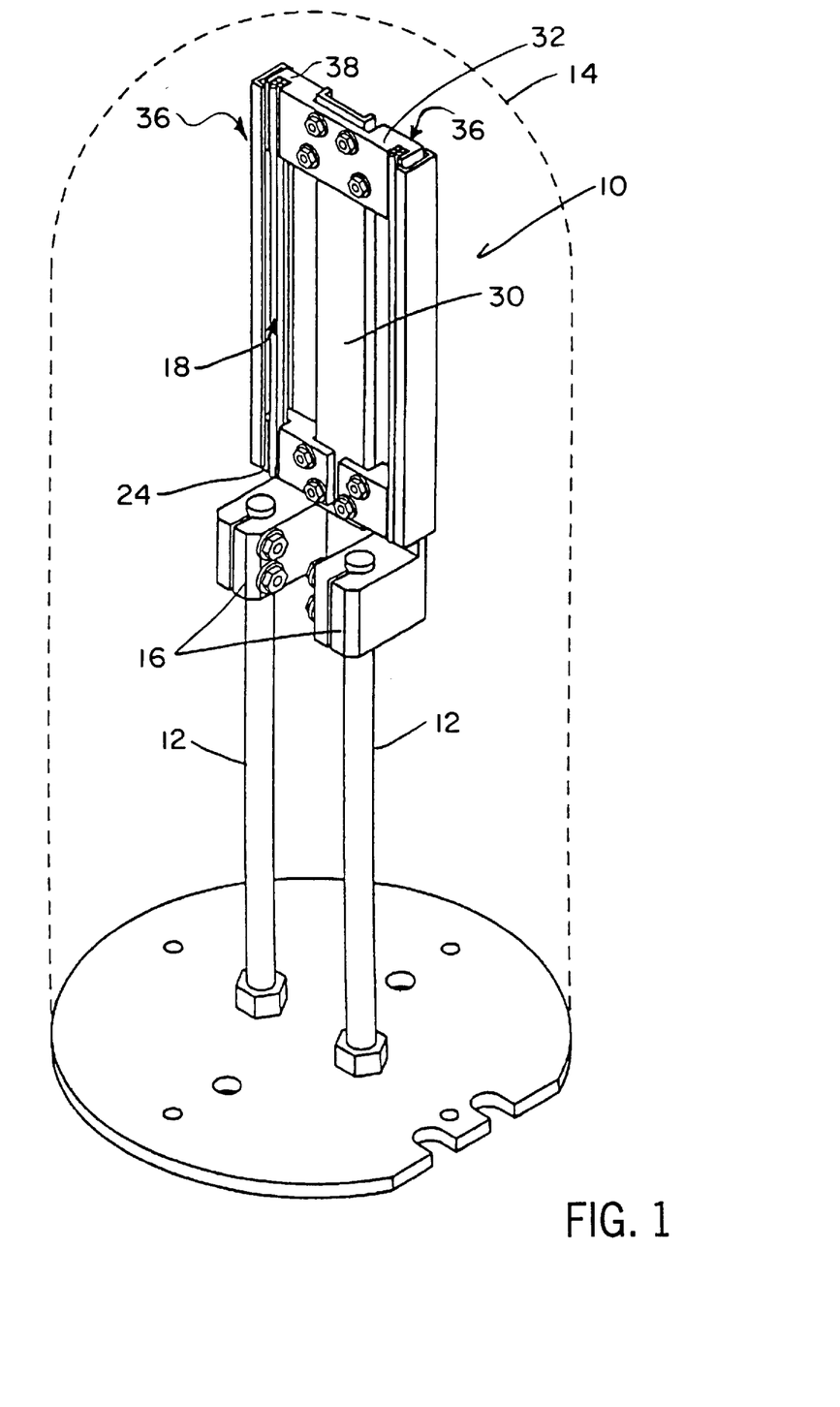
FIG. 1 illustrates a perspective view of a magnetically activated switch constructed in accordance with one form of the invention.

FIG. 1 illustrates a magnetically activated superconductor switch 10 (hereinafter, "switch 10") constructed in accordance with one form of the invention. Current flows into and out of the switch 10 via massive copper rod current leads 12. These current leads 12 connect to the magnetically activated switch 10 inside a cryostat or dewar 14 and also to the rest of the electric circuit outside the dewar 14. Copper clamps 16 provide a relatively low resistance connection from the current leads 12 to a high temperature superconductor assembly 18. While the current leads 12 and the copper clamps 16 are described as comprising copper, it will be apparent that other electrically conductive materials can also be used.

Figures 2A, 2B, 3:
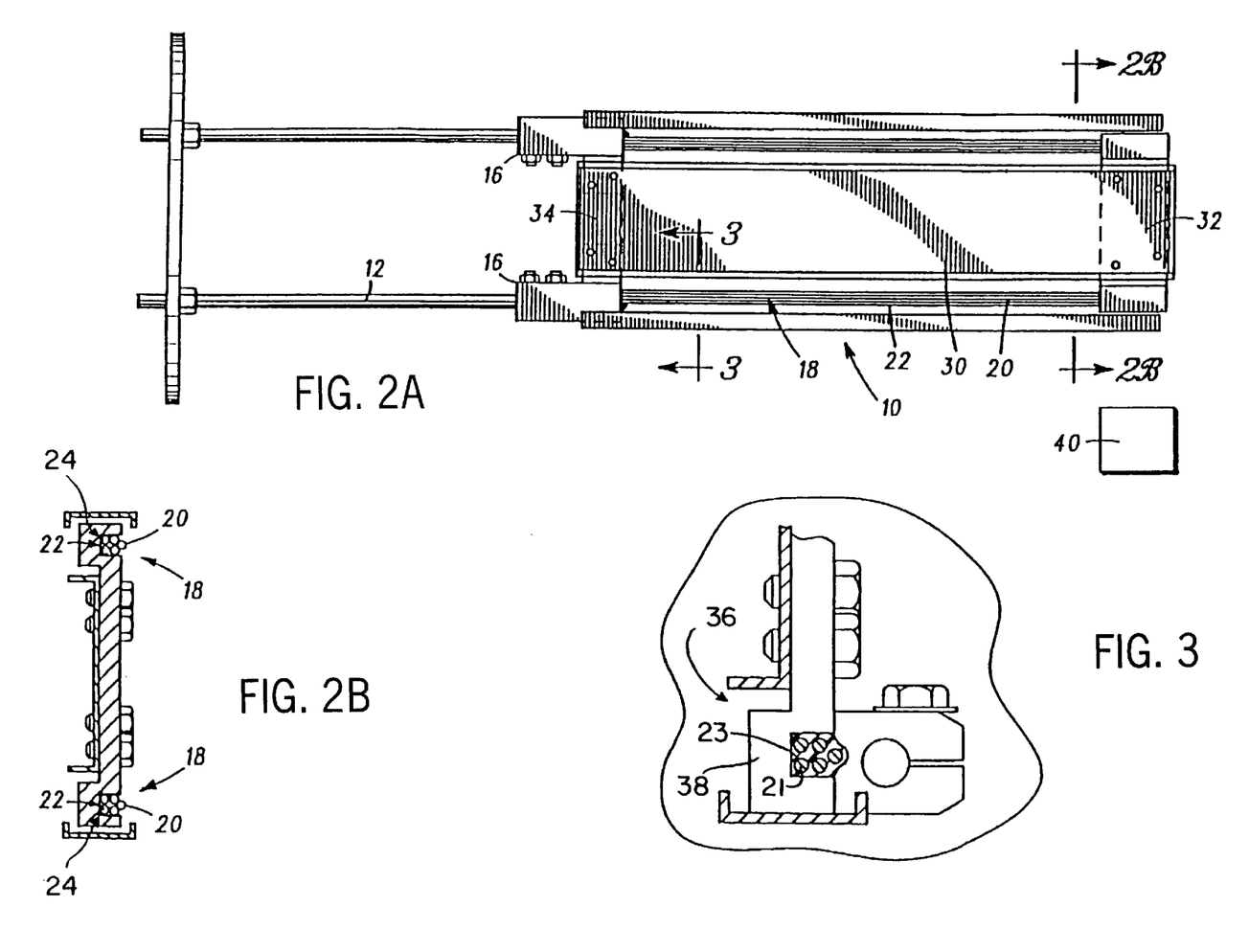
FIG. 2A shows a back view of the switch illustrated in FIG. 1.
FIG. 2B is a cross section taken along 2B—2B in FIG. 2A.
FIG. 3 is a cross section taken along 3—3 in FIG. 2A and illustrates an alternative form of bundled high temperature superconductor rods.

As shown in FIGS. 2A and 2B, the high temperature superconductor assembly 18 can take the form of thin solid rods 20 (also referred to in the art as "fibers") or thick films (not shown). In the illustrated preferred embodiment, multiple ones of the solid rods 20 are grouped together in two bundles 22. Below its critical current level, each of the solid rods 20 can carry a certain amount of current with no resistance. Accordingly, the number of the solid rods 20 connected in parallel in each of the bundles 22 dictates the amount of current that the switch 10 can carry in the superconducting mode. The high temperature superconductor assembly 18 can include one or numerous ones of the bundles 22 containing various numbers of the solid rods 20 or, alternatively, take the form of a single one of the rods 20 (or a bar, tube or various other shapes instead of the bundle 22.)

In the preferred embodiment, low resistance contacts can be made by first tinning channels 24 (shown in FIG. 2B) in the copper clamps 16 with a thin layer of lead-tin solder, then burying current pads (not shown, but located at the ends of the rods 20) in indium or indium alloy solder in the tinned channels 24. The copper clamps 16 are sufficiently massive to provide good mechanical support and have insignificant resistance.

Because the ceramic solid rods 20 are relatively brittle, additional mechanical support is desirable to prevent damage to the high temperature superconductor assembly 18. Such support is provided by a stainless steel beam 30 fastened to the two copper clamps 16 and a copper connecting block 32 at the bottom of the switch 10. The thermal expansion of the stainless steel beam 30 between room temperature and 77 K (the operating temperature range of the switch 10) is closely matched to the coefficient of thermal expansion (CTE) of the superconductor material selected. While various materials can be used, YBCO is described herein for nonlimiting, illustrative purposes.

The shape and size of the stainless steel beam 30 are designed to allow the beam to heat and cool at substantially the same rate as the bundle 22 of the solid rods 20. This design helps to ensure the temperature and, therefore, the length of both the YBCO and stainless steel parts are the same at all times. The required thickness of the stainless steel beam 30 can be so small that additional support is needed between the two top copper clamps 16. As shown in FIGS. 1 and 2, this can be provided by a thick plate 34 (shown in phantom) attached to the thin stainless steel beam 30 between the copper clamps 16. Electrical insulation for the active current carrying components of the switch 10 can be provided at the connection points by washers and/or bushings made of a material (such as Teflon) that can withstand the temperatures necessary to perform indium soldering.

The magnetically activated switch 10 was tested in various conditions, including zero applied field and both continuous and pulsed magnetic fields produced by a solenoid 40 (see FIG. 2A). The test results are summarized in the following text and in FIGS. 3–11. A highly preferred embodiment of the magnetically activated switch 10 is illustrated schematically in FIGS. 1 and 2. FIG. 2 illustrates the copper clamps 16 used outside the dewar 14 to connect the massive copper rod current leads 12 of the superconductor circuit to a conventional power supply and conventional load circuit (not shown). The background resistance of the switch 10, i.e., the resistance while the high temperature superconductor solid rods 20 were in the superconducting state, was approximately $35\mu\Omega$. This resistance included resistances from all the internal electrical connections and the copper clamps 16 on the sections of the massive copper rod current leads 12 protruding outside the dewar 14.

In another preferred form of the invention, as shown in FIG. 3, bundled high temperature superconductor rods 21 are embedded in an epoxy 23 or other medium providing the mechanical support, such as is provided by the stainless steal beam 30 described above. The epoxy also serves to provide thermal mass, providing improved cryostability against unwanted quenching due to thermal excursions.

In another aspect of the embodiment of FIG. 3, embedded rods 21 are also spaced apart from one another as compared to FIG. 2B. Therefore, the magnetic fields generated by current flow in the rods 21 have substantially reduced magnitude at the adjacent rods 21, thereby enabling greater current flow in the superconducting state. As an illustration, if the rods are spaced apart by about 3 mm, the magnetic field has virtually no effect on current carrying capacity at the levels described herein.

Figure 5A:
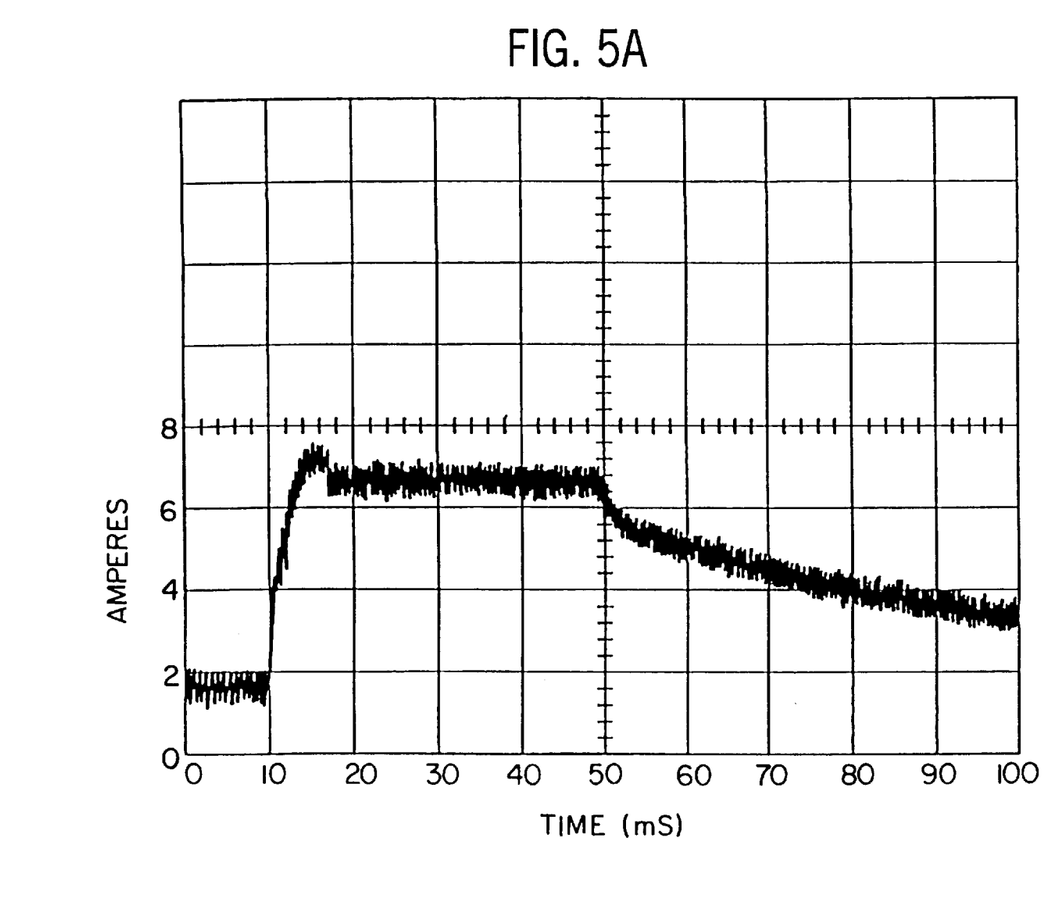
Figure 5B:
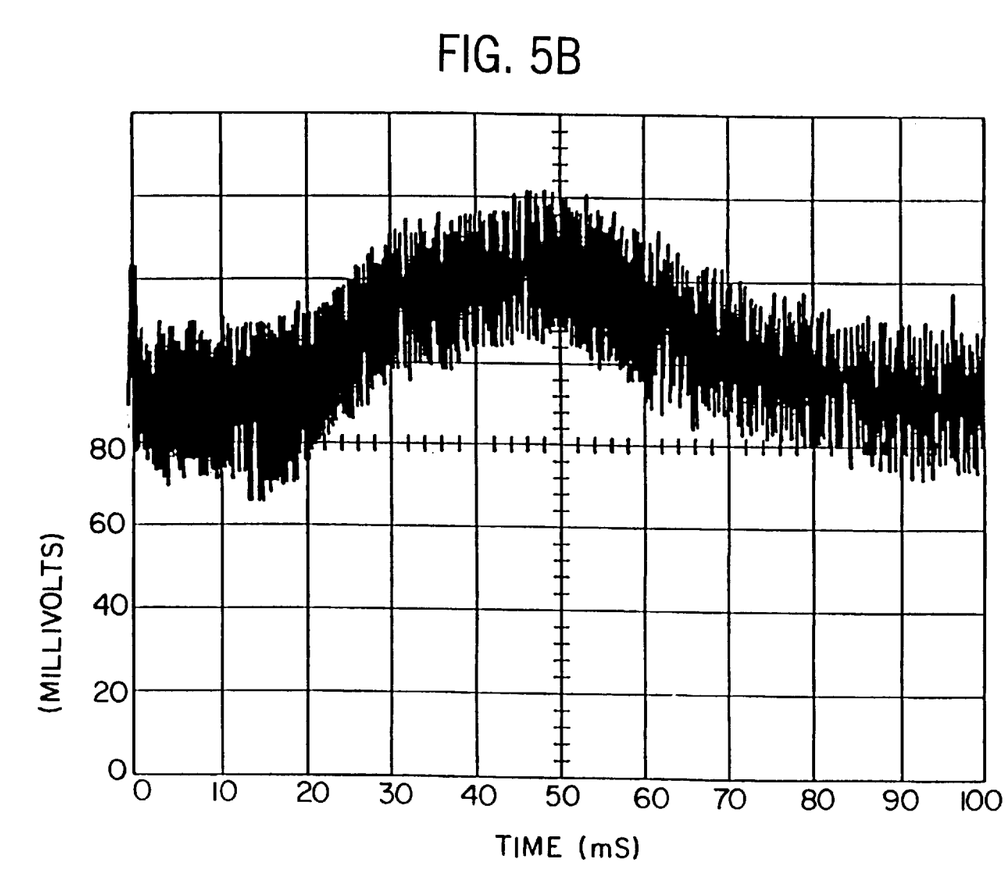
FIG. 5B shows the voltage across the superconductor circuit.
Figure 6A:
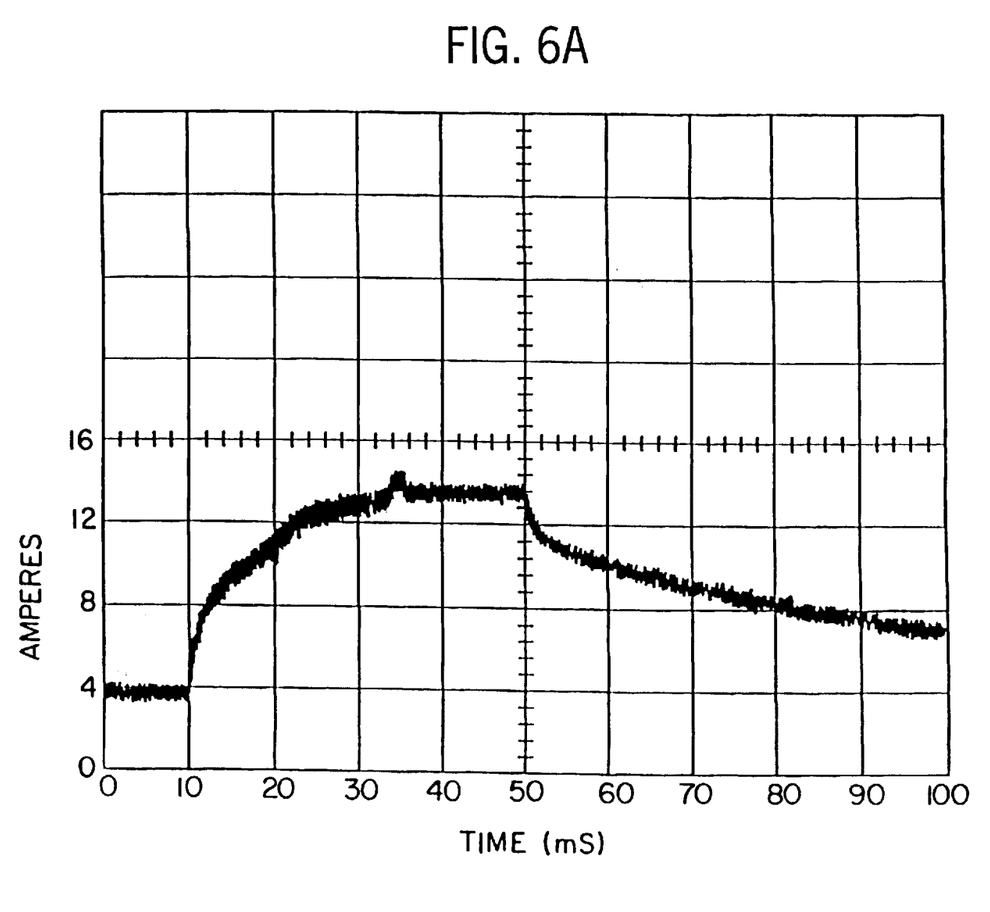
Figure 6B:
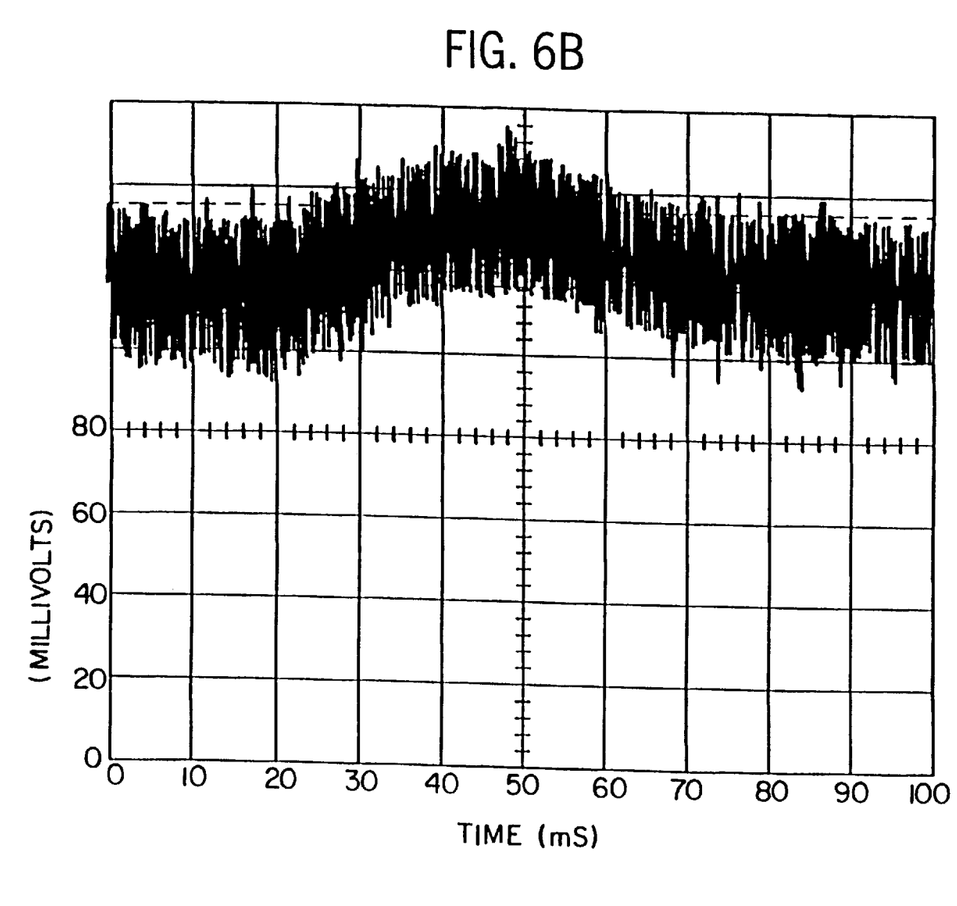
FIG. 6B shows the voltage across the superconductor circuit.
Figure 7A:
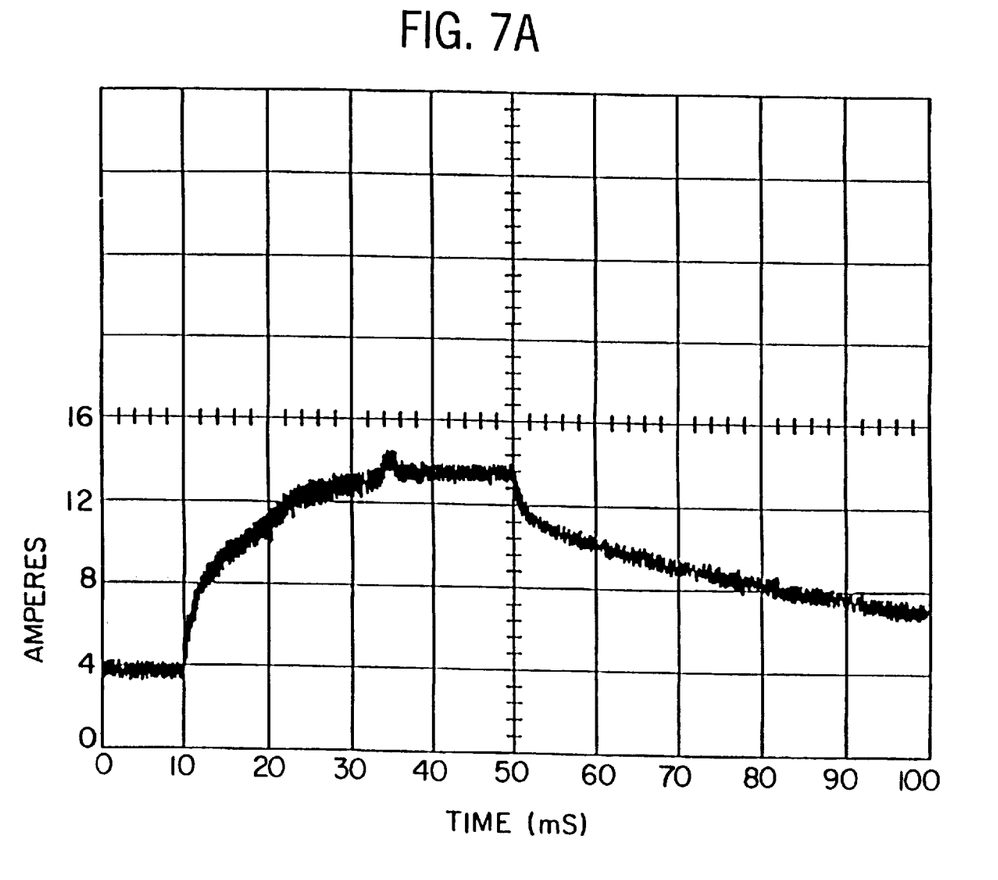
Figure 7B:
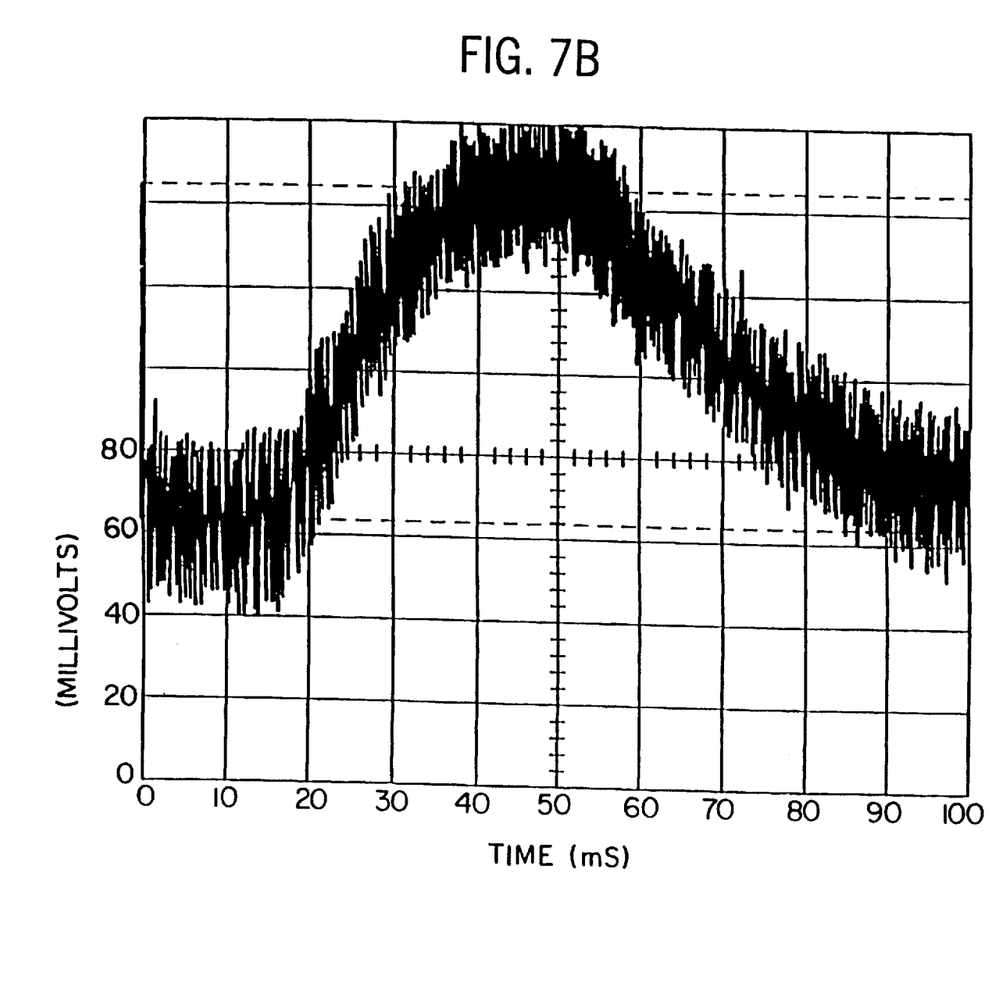
FIG. 7B shows the voltage across the superconductor circuit.

The dynamic response of the magnetically activated switch 10 is shown in FIGS. 5–7. In the switch 10, continuous current is flowing through the switch 10 with the solenoid 40 current pulsed for 40 ms. FIGS. 5A, 6A and 7A show the current in the solenoid 40. FIGS. 5B, 6B and 7B show the voltage across the superconductor circuit. FIGS. 5A and 5B were recorded with 5 A carried by the superconductor circuit and the solenoid 40 being pulsed with 5A (corresponding to a field of approximately 450 Gauss). FIGS. 6(A and B) and 7(A and B) were recorded with 2 A and 5 A current, respectively, being carried by the superconductor circuit and with the solenoid 40 pulsed with 10 A current. Some of the observed lag time in the magnetically activated switch 10 response is attributable to the ramp-up of current and field in the solenoid 40; the rest of the lag can be attributed in part to the gradual penetration of magnetic field into the superconductor.

Figure 8:
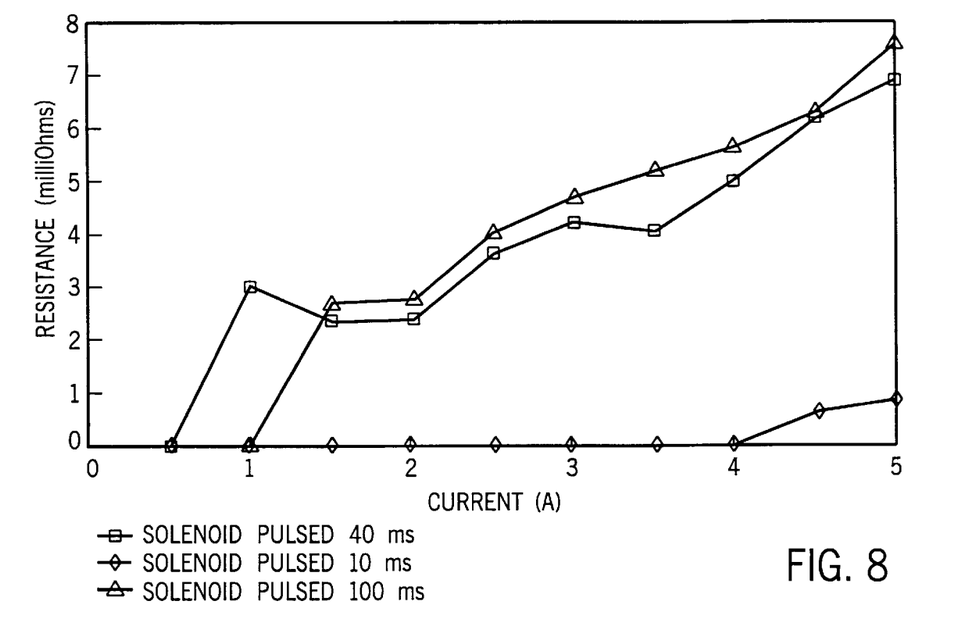
FIG. 8 shows the final resistance in the magnetically activated switch in magnetic fields where the solenoid was pulsed at 5 A current for time periods of 10, 40, and 100 ms.
Figure 9:
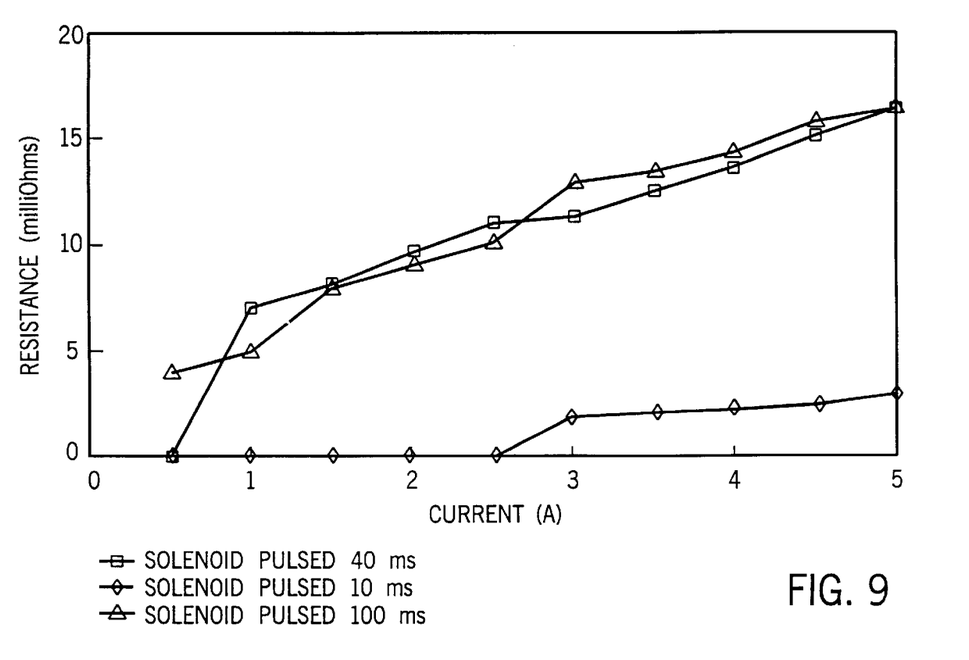
FIG. 9 illustrates the final resistance in the magnetically activated switch in magnetic fields where the solenoid was pulsed at 10 A current for time periods of 10, 40, and 100 ms.

FIGS. 8 and 9 show the final resistance in the magnetically activated switch 10 in magnetic fields where the solenoid 40 was pulsed at 5 A (FIG. 8) and 10 A (FIG. 9) for times of 10, 40, and 100 ms. Pulse lengths of at least 40 ms long develop fill resistance in the magnetically activated switch 10.

Figure 10A:
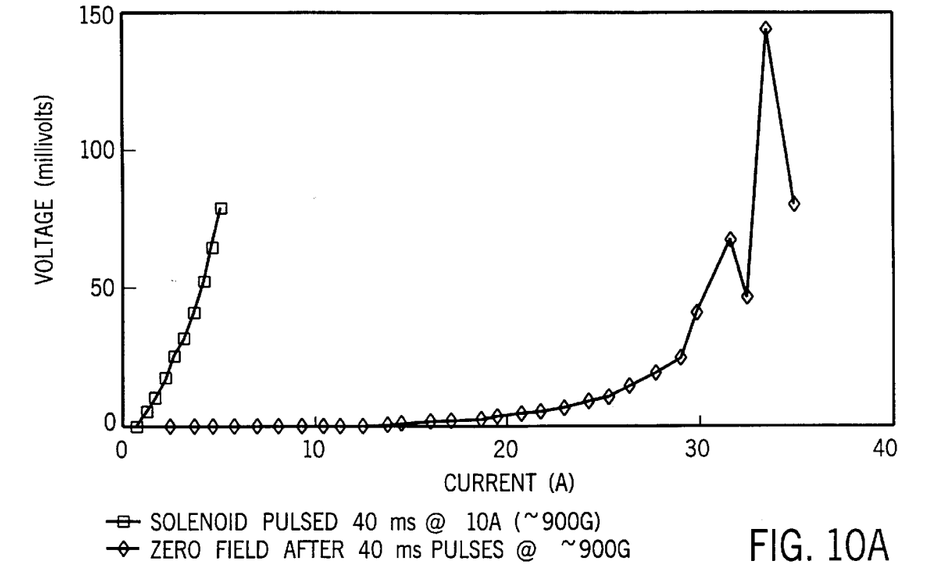
FIGS. 10A, 10B and 10C show, on three different scales, respectively, the I-V curves of the magnetically activated switch (the superconductor) while carrying a constant current while the solenoid is pulsed for 40 ms (approximately 900 G field pulses) and also in zero applied field after being exposed to magnetic fields.
Figure 10B:
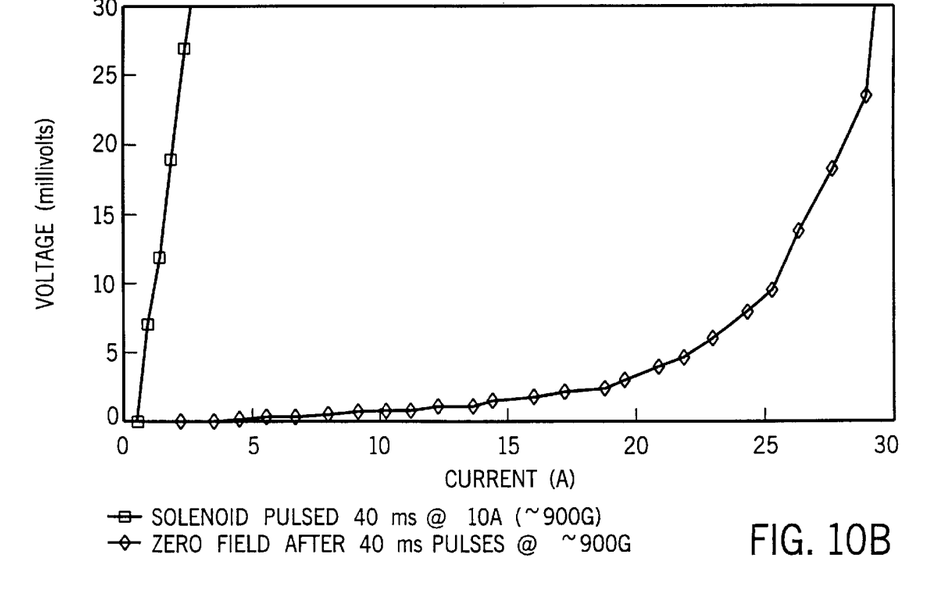
Figure 10C:
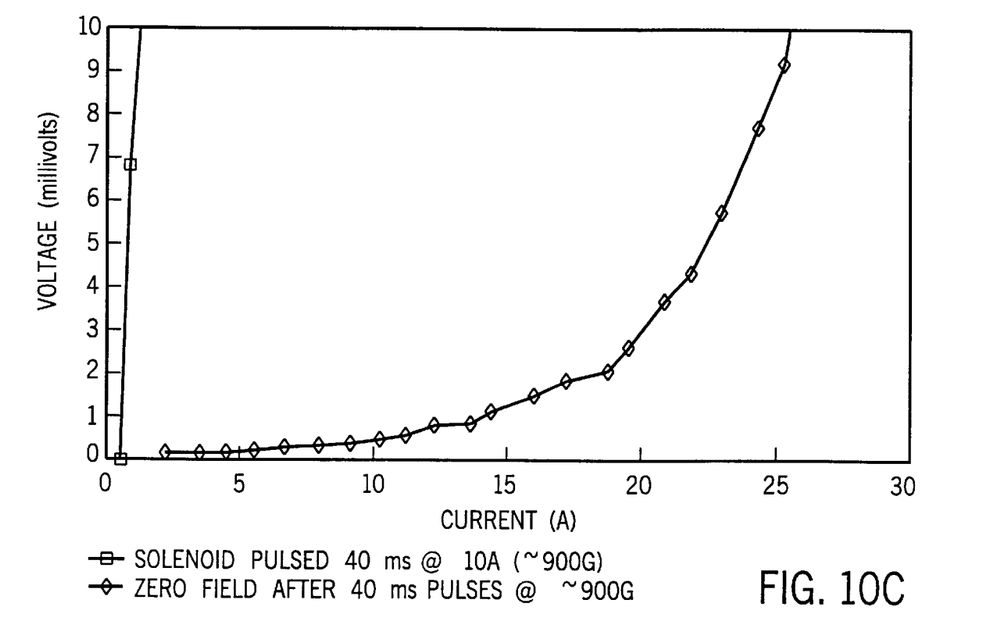
Figure 11A:
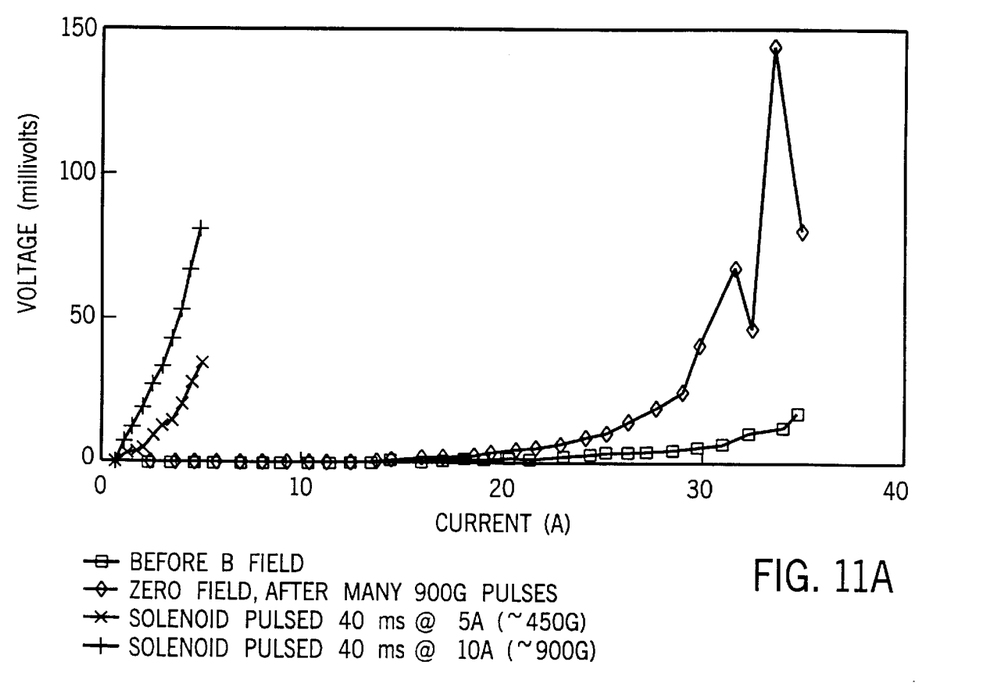
FIGS. 11A and 11B illustrate a zero field curve before and after pulse field application, and these two figures (same data, different scales) also show the I-V curve of the magnetically activated switch for 40 ms pulses at approximately a 450 G (5 A) and 900 G (10 A) fields.
Figure 11B:
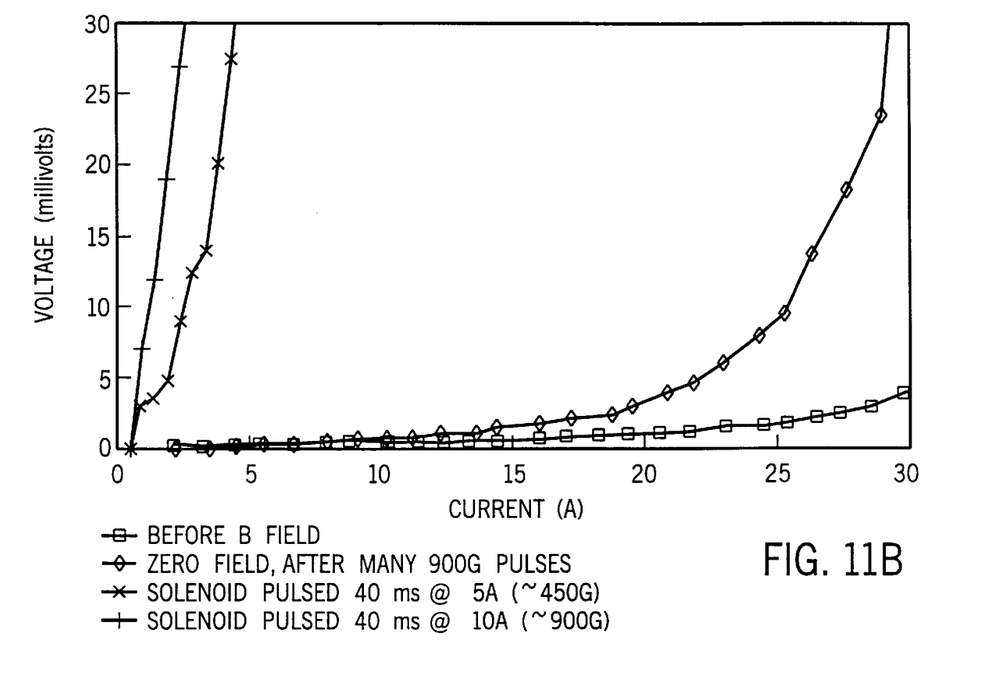

FIGS. 10A, 10B and 10C show, on three different scales, the I-V curves of the magnetically activated switch 10 while carrying a constant current in 40 ms with approximately 900 G field pulses, and in zero applied field after being exposed to magnetic field. As shown in FIGS. 11A and 11B, the zero field curve was much higher after the high temperature superconductor sections were exposed to magnetic field than beforehand, magnetic flux apparently being trapped inside the superconductor solid rods 20. These two figures (same data, different scales) also show the I-V curve of the magnetically activated switch 10 in 40 ms with approximately 450 G field pulses.

Figure 12:
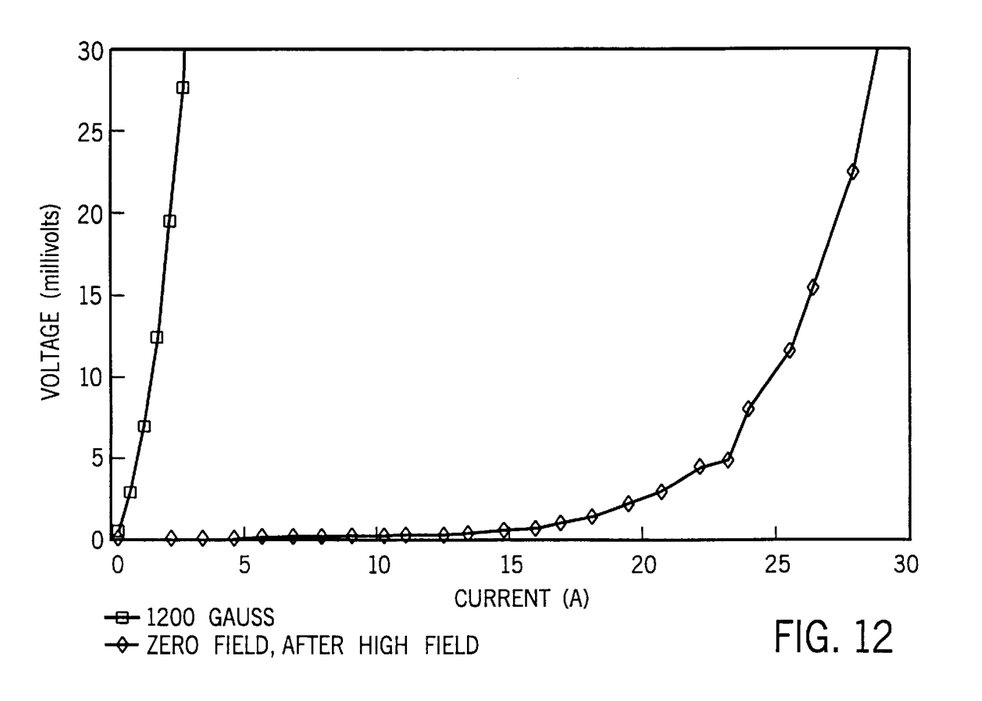
FIG. 12 shows the I-V behavior of the magnetically activated switch after end of exposure to continuous magnetic fields of approximately 1200 G and for ongoing exposure to a field of 1200 G.
Figure 13A:
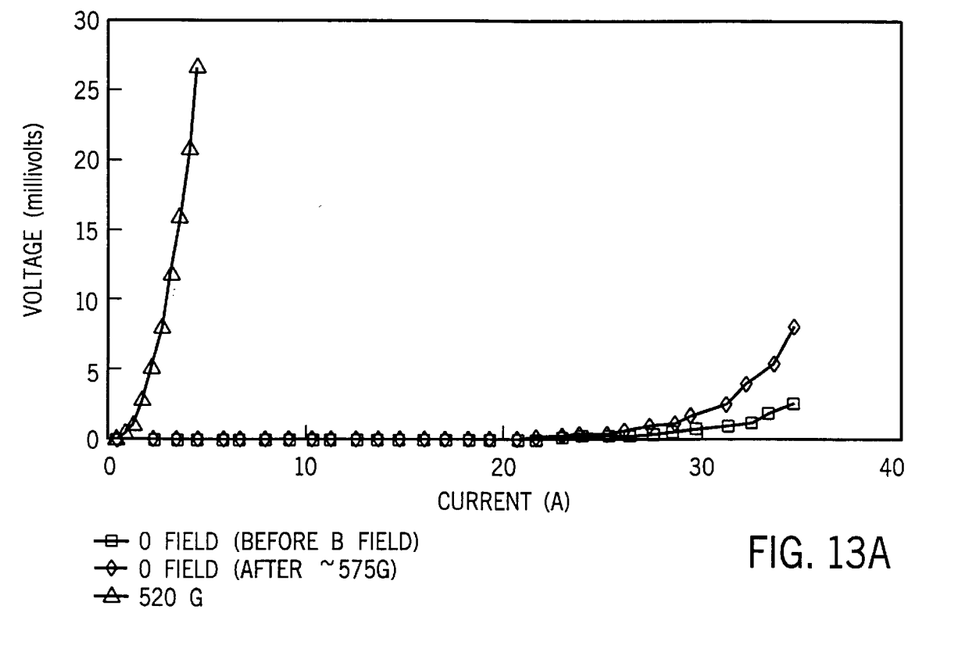
FIGS. 13A and 13B (same data, different scales) illustrate the I-V behavior of the magnetically activated switch before, during and after exposure to continuous magnetic fields of approximately 520–575 G.
Figure 13B:
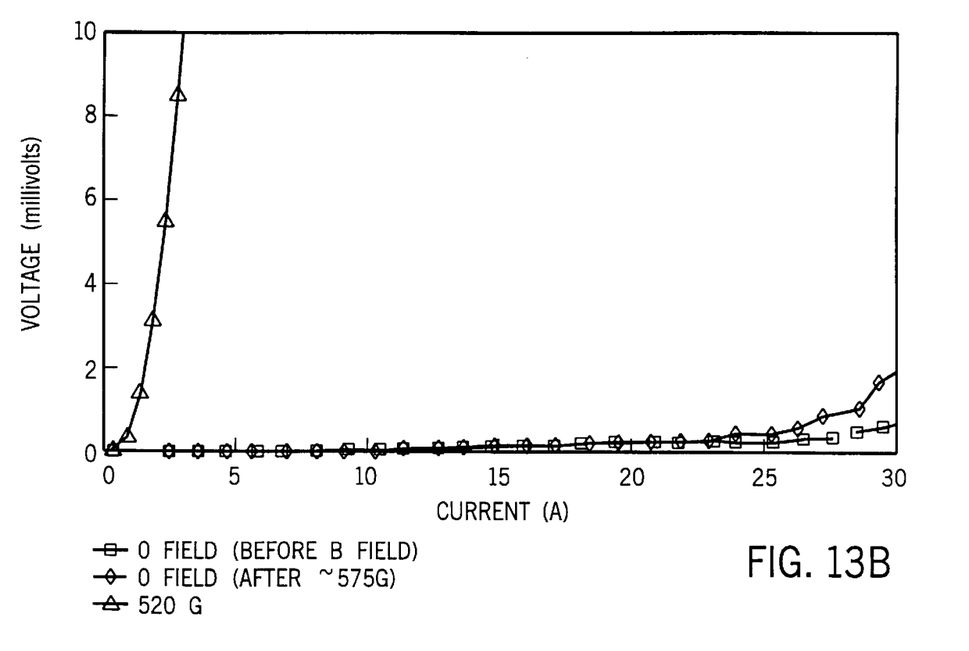

The penetration and subsequent trapping of magnetic flux in the superconductor solid rods 20 can result in an increase in the zero field voltage after repeated and prolonged exposure to the magnetic field. This trapped flux can be eliminated by heating the high temperature superconductor solid rods 20 above their $T_c$ or by running current through the superconductor well in excess of its $I_c$; these methods are not however feasible in all applications. FIG. 12 and FIGS. 13(A and B) illustrate the I-V behavior of the switch 10 when exposed to continuous magnetic fields of approximately 1200 G and approximately 520 G. Note that the zero field curve after exposure to the lower field is only slightly greater than the zero field curve before exposure, while the zero field curve after exposure to the high field is much higher. Depending on the application, optimum overall performance can be attained by using either a low or high magnetic field. The trade-off in performance is as follows: when using high magnetic fields, the maximum safe current through the switch 10 in the unswitched state will be less than when lower fields are used. On the other hand, when using low magnetic fields, the resistance in the switched state will be smaller than that achievable when high fields are employed. Regardless of what level of magnetic field is used, the $I_c$ of the switch 10 can be increased by increasing the effective cross-section of the high temperature superconductor solid rods 20 (by adding more of the rods 20 to each bundle 22), and the switched state resistance can be increased by lengthening the high temperature superconductor segments. The properties of the switch 10 can thus be adjusted to meet the performance needs of a particular application circuit.

The switch 10 also preferably includes a thermal shielding structure to lessen thermal shock to the solid rods 20 when the dewar 14 is opened or temperature changes occur near the solid rods 20 in the dewar 14 for any reason. While such a thermal shielding structure can comprise a wide variety of shapes, preferably the channel 24 can be used as the thermal shielding structure as shown in FIGS. 1 and 3. The channel 24 can be mounted in different ways so long as it is held adjacent the high temperature superconductor assembly 18. In the preferred embodiment of the invention shown in FIGS. 1 and 2, the two channels 24 are held adjacent the solid rods 20 by attaching the channels 24 via bolts (or other conventional fastening means) to the upper copper block 32. These channels 24 cover, but are not attached to, the clamp 16.

In order to enable reliable thermal cycling and compatible operational materials, the "U"-channel 24 preferably has a thermal expansion coefficient ("CTE") close to that of YBCO (or whatever high temperature superconductor material is used) and has a heat capacity roughly matching that of the YBCO rod bundles 22. While stainless steel has been used satisfactorily, most iron alloys and nickel alloys having thermal expansion coefficients roughly in the $11-13 \times 10^{-6}$ range can also be used with YBCO. For example, materials such as Inconel, zirconium oxide or other similar materials could be used. One can decrease certain undesirable effects arising from significantly different thermal expansion characteristics between the specific alloy and the YBCO by shortening the length of the YBCO solid rods 20. However, in the most preferred embodiments of the invention, a closer thermal expansion characteristic match is highly desirable. It will be apparent to one of ordinary skill in the art that other superconducting materials having different CTE than YBCO can be selected for use with support materials having CTEs that are closely matched to the selected superconducting material.

Figure 4:
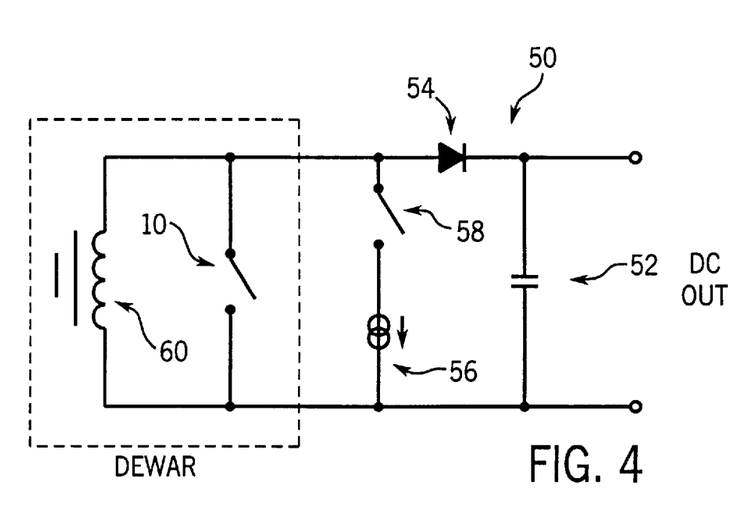
FIG. 4 illustrates a pulse width modulator employing a magnetically activated superconductor switch.

An example of a typical application of the switch 10 is illustrated in FIG. 4 in the form of use in a pulse width modulator voltage regulator circuit 50. The circuit 50 includes capacitor bank 52, blocking diode 54, a charging current source 56, a charging switch 58 and a magnet 60. The circuit is shown in a magnet discharge mode with the switch 10 open. In a storage mode the switch 10 would be closed.

While a variety of production processes can be used to make the solid rods 20, the following process is preferably used: A commercially available YBCO powder is mixed with an organic binder and solvents and the resultant paste is extruded to form a "green" form of the solid rods 20. Lengths of this green solid rod 20 are then fired in a partial vacuum containing 2 torr of oxygen at a temperature of 810° C. for 2 hours, following a low temperature heat treatment to burn off the residual organics present in the green solid rod 20. Subsequent to firing, the sintered form of the solid rods 20, have, for example, a typical diameter of 0.035" and are cut to length (e.g., 19 cm). Silver contacts are applied to the solid rods 20 by painting the end of each of the solid rods 20 with a commercial silver paint. The solid rods 20 are then annealed in oxygen utilizing controlled cooling from 750° C. to densify the silver contacts and develop their superconducting properties. After firing and annealing, the critical current of each of the individual solid rods 20 is measured, and only those having an $I_c$ between 4.5 A and 6.5 A is preferably selected for use in the present invention.

The conductor bundle 22 is produced by soldering eight of the solid rods 20 together at their silver contacts using an indium solder. The bundle 22 is then attached to the magnetic switch 10 by soldering it into the appropriate channels in the OFHC copper end connectors. Two such ones of the bundles 22 are prepared for the completed switch 10.

The present invention therefore provides an extremely low resistance switch that is activated by the application of a magnetic field. A thermal shield including materials thermally compatible with the superconductor can be used to protect superconducting components of the switch from thermal shock. This shielding can extend the life of the superconducting components and enables more predictable switch response in varying thermal conditions.

While preferred embodiments of the invention have been shown and described, it will be clear to those skilled in the art that various changes and modifications can be made without departing from the invention in its broader aspects as set forth in the claims provided hereinafter.

What is claimed is:

1. A magnetically activated switch for use in a electrical circuit, comprising:

a high temperature superconducting component for acting as a connected switch element through which current flows in an electrical circuit, said superconducting component being coupled at both ends by a substantially rigid beam, and said beam having a coefficient of thermal expansion near that of said superconducting component;

a thermal shield structure disposed adjacent said superconducting component for decreasing thermal shock to said superconducting component from temperature changes occuring near said superconducting component; and a magnetic field generating structure disposed adjacent said superconducting component, and said magnetic filed generating structure for generating a field sufficient to cause the superconducting component to transition to a resistive state upon activation of said magnetic field generating structure, said superconducting component returning to a superconducting state when said magnetic field generating structure is deactivated.

2. The switch as defined claim 1 wherein said magnet means comprises at least one of an electromagnet and a solenoid.

3. The switch as defined in claim 1 wherein said superconducting component comprises a bundle of superconductor rods.

4. The switch as defined in claim 3 wherein each of said rods is displaced from an adjacent one of said rods thereby reducing the magnetic field generated at its adjacent rod from current flow and further thereby increasing the level of current which can flow in said rods.

5. The switch as defined in claim 1 wherein said substantially rigid beam comprises a metal having a coefficient of linear thermal expansion in the range of about $11\text{--}13 \times 10^{-6}$ in./in. C.

6. The switch as defined in claim 1 wherein said substantially rigid beam comprises stainless steel.

7. The switch as defined in claim 1 wherein said thermal shield structure comprises a U-shaped channel.

8. The switch as defined in claim 1 wherein said superconducting component is connected at an end thereof to said beam by a conductive block structure.

9. The switch as defined in claim 8 wherein said conductive block structure comprises a copper block.

10. The switch as defined in claim 1 further including a pulse width modulator regulator circuit coupled to said switch.

11. The switch as defined in claim 1 wherein said superconducting component is embedded in a thermal shock barrier material.

12. The switch as defined in claim 11 wherein said thermal shock barrier material comprises an epoxy.

13. An electrical circuit including a magnetically activated switch, comprising:

a high temperature superconducting component coupled to an electrical circuit as a connected switch element by current leads including copper, said supercoducting component being coupled at both ends by a substantially rigid beam and said beam having a coefficient of thermal expansion near that of said component;

a substantially U-shaped thermal shield structure disposed adjacent said superconducting component for decreasing thermal shock to said component from temperature changes occuring near said superconducting component; and a solenoid disposed adjacent said superconducting component, said solenoid generating a magnetic filed sufficient to cause the superconducting component to transition to a resistive state, upon activation of said solenoid, and said superconducting component returning to a superconducting state when said solenoid is deactivated.

14. The electrical circuit as defined in claim 13 wherein said superconducting component is embedded in a thermal shock barrier material.

15. The electrical circuit as defined in claim 14 wherein said superconducting component comprises at least one rod and said thermal shock barrier material comprises an epoxy.

16. The magnetically activated switch as defined in claim 13 further including at least one of a switchable circuit and a pulse width modulator regulator coupled to said switch.

17. A magnetically activated switch for use in an electrical circuit, comprising:

a high temperature superconducting component as a connected switch element through which current flows in an electrical circuit, said superconducting component being coupled at both ends by a substantially rigid beam, and said beam having a coefficient of thermal expansion near that of said superconducting component;

a thermal shield structure disposed adjacent said superconducting component for decreasing thermal shock to said superconducting component from temperature changes occuring near said superconducting component; and a magnetic field generating structure disposed adjacent to and separate from said superconducting component and also as a separate component from said superconducting component in the electrical circuit, and said magnetic field generating structure for generating a field sufficient to cause the superconducting component to transition to a resistive state upon activation of said magnetic field generating structure said superconducting component returning to a superconducting state when said magnetic field generating structure is deactivated.

18. The switch as defined in claim 17 wherein said magnet means comprises at least one of an electromagnet and a solenoid.

19. The switch as defined in claim 17 wherein said superconducting component comprises a bundle of superconductor rods.

20. The switch as defined in claim 17 wherein said substantially rigid beam comprises a metal having a coefficient of linear thermal expansion in the range of about $11\text{--}13 \times 10^{-6}$ in./in. °C.

21. The switch as defined in claim 17 wherein said superconducting component is embedded in a thermal shock barrier material.

* * * * *